(12) United States Patent
Brown, Jr.

(10) Patent No.: US 10,547,281 B1
(45) Date of Patent: Jan. 28, 2020

(54) SOURCE IMPEDANCE TUNING CIRCUIT FOR A RECEIVE PATH

(71) Applicant: QUALCOMM Incorporated, San Diego, CA (US)

(72) Inventor: Gary Lee Brown, Jr., Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/034,530

(22) Filed: Jul. 13, 2018

(51) Int. Cl.
| | |
|---|---|
| H03H 7/01 | (2006.01) |
| H04B 1/16 | (2006.01) |
| H04W 16/32 | (2009.01) |
| H03F 3/19 | (2006.01) |
| H03F 3/24 | (2006.01) |

(52) U.S. Cl.
CPC ............. H03H 7/0115 (2013.01); H04B 1/16 (2013.01); *H03F 3/19* (2013.01); *H03F 3/245* (2013.01); *H03F 2200/165* (2013.01); *H03F 2200/294* (2013.01); *H03F 2200/451* (2013.01); *H04W 16/32* (2013.01)

(58) Field of Classification Search
None
See application file for complete search history.

(56) References Cited

U.S. PATENT DOCUMENTS

| | | | | |
|---|---|---|---|---|
| 3,193,776 | A * | 7/1965 | Stracca | H03F 3/12 327/494 |
| 5,347,280 | A * | 9/1994 | Schuermann | G01S 13/758 342/42 |
| 6,037,848 | A * | 3/2000 | Alila | H01P 1/205 333/202 |
| 6,388,544 | B1 * | 5/2002 | Ella | H03H 3/04 333/188 |
| 8,890,633 | B2 * | 11/2014 | Simons | H03L 5/00 331/116 FE |
| 2003/0164745 | A1 * | 9/2003 | Takamine | H03H 9/0038 333/195 |
| 2004/0263286 | A1 * | 12/2004 | Unterberger | H03H 9/605 333/187 |
| 2005/0101274 | A1 * | 5/2005 | Toh | H03J 3/08 455/180.1 |
| 2007/0091008 | A1 * | 4/2007 | Mortazawi | H01Q 3/26 343/864 |

(Continued)

*Primary Examiner* — Lana N Le
(74) *Attorney, Agent, or Firm* — Patterson & Sheridan, L.L.P.

(57) ABSTRACT

Methods and apparatuses for tuning source impedance for at least a portion of a receive path in a radio frequency front-end. An exemplary circuit generally includes a first tunable resonant circuit having an output coupled to an input of the at least the portion of the receive path and a second tunable resonant circuit having an input coupled to the output of the first tunable resonant circuit and to the input of the at least the portion of the receive path. The circuit also includes a first control input coupled to the first tunable resonant circuit and configured to adjust an impedance of the first tunable resonant circuit based on a frequency response of an output of the at least the portion of the receive path, and a second control input coupled to the second tunable resonant circuit and configured to adjust an admittance of the second tunable resonant circuit.

17 Claims, 9 Drawing Sheets

(56) References Cited

U.S. PATENT DOCUMENTS

| | | | | |
|---|---|---|---|---|
| 2013/0278356 | A1* | 10/2013 | Meltaus | H03H 9/564 |
| | | | | 333/187 |
| 2014/0266828 | A1* | 9/2014 | Matsukawa | H03H 11/0433 |
| | | | | 341/143 |
| 2015/0070058 | A1* | 3/2015 | Rada | H03F 3/193 |
| | | | | 327/156 |
| 2016/0020268 | A1* | 1/2016 | Suwada | H01L 23/49833 |
| | | | | 257/532 |
| 2016/0094199 | A1* | 3/2016 | David | H03H 7/38 |
| | | | | 333/133 |
| 2016/0276997 | A1* | 9/2016 | Teramoto | H03H 7/427 |
| 2016/0359459 | A1* | 12/2016 | Zhu | H03F 1/223 |
| 2016/0373088 | A1* | 12/2016 | Rehm | H04N 3/16 |
| 2017/0187368 | A1* | 6/2017 | Thomas | H03J 5/246 |
| 2017/0288736 | A1* | 10/2017 | Zhou | H04B 5/0037 |
| 2017/0301992 | A1* | 10/2017 | Khlat | H01Q 5/335 |
| 2018/0259566 | A1* | 9/2018 | Schneider | G01R 31/34 |

* cited by examiner

SOURCE IMPEDANCE TUNING CIRCUIT FOR A RECEIVE PATH

FIELD OF THE DISCLOSURE

Certain aspects of the present disclosure generally relate to electronic circuits and, more particularly, to a circuit for tuning a source impedance for a receive path circuit.

DESCRIPTION OF RELATED ART

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of user equipments. A user equipment (UE) may communicate with a base station (BS) via a downlink and an uplink. The UE and/or BS may include a radio frequency front-end (RFFE) for transmitting and/or receiving radio frequency (RF) signals, and the receive path of the RFFE may include any of various suitable types of low-noise amplifiers (LNAs). The performance of the receive path may degrade as the source impedance seen by the LNA varies, for example, due to changes in operational mode of a device or implementation of the same RFFE design in different devices with different transmission line lengths.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved radio frequency front-end capable of tuning to any desired source impedance.

Certain aspects of the present disclosure provide a tuning circuit for tuning a source impedance for at least a portion of a receive path in a radio frequency front-end. The tuning circuit generally includes a first tunable resonant circuit having an output coupled to an input of the at least the portion of the receive path and a second tunable resonant circuit having an input coupled to the output of the first tunable resonant circuit and to the input of the at least the portion of the receive path. The tuning circuit also includes a first control input coupled to the first tunable resonant circuit and configured to adjust an impedance of the first tunable resonant circuit based on a frequency response of an output of the at least the portion of the receive path, and a second control input coupled to the second tunable resonant circuit and configured to adjust an admittance of the second tunable resonant circuit.

Certain aspects of the present disclosure provide a method of tuning a source impedance for at least a portion of a receive path in a radio frequency front-end. The method generally includes introducing an input signal into the at least the portion of the receive path, via a first tunable resonant circuit having an output coupled to an input of the portion of the receive path and a second tunable resonant circuit having an input coupled to the output of the first tunable resonant circuit and to the input of the at least the portion of the receive path; obtaining an output signal from the at least the portion of the receive path, the output signal being based on the input signal; adjusting an impedance of the first tunable resonant circuit based on a frequency response of the output signal; and after adjusting the impedance of the first tunable resonant circuit, adjusting an admittance of the second tunable resonant circuit.

Certain aspects of the present disclosure provide an apparatus for tuning a source impedance for at least a portion of a receive path in a radio frequency front-end. The apparatus generally includes means for introducing an input signal into the at least the portion of the receive path, the means for introducing comprising first tunable resonating means coupled to an input of the at least the portion of the receive path, and second tunable resonating means coupled to an output of the first tunable resonating means and to the input of the at least the portion of the receive path. The apparatus also includes means for obtaining an output signal from the at least the portion of the receive path, the output signal being based on the input signal, means for adjusting an impedance of the first tunable resonating means based on a frequency response of the output signal, and means for adjusting an admittance of the second tunable resonating means, after adjusting the impedance of the first tunable resonating means.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide apparatus and methods for tuning a source impedance for at least a portion of a receive path in a radio frequency (RF) front-end.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (SGTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communication System

Figure 1:
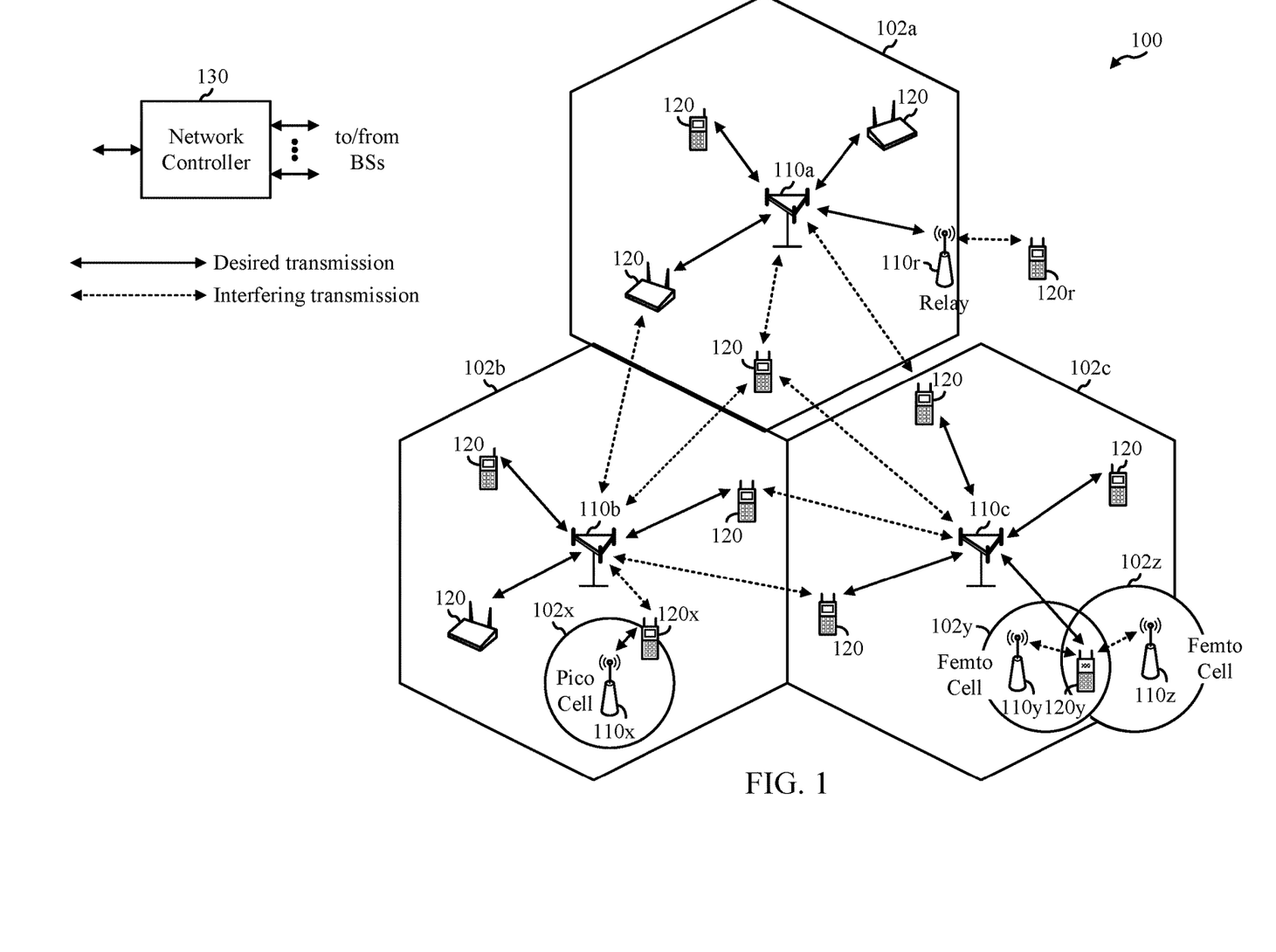
FIG. 1 is a block diagram conceptually illustrating an example telecommunications system, in accordance with certain aspects of the present disclosure.

FIG. 1 illustrates an example wireless communication network 100 in which aspects of the present disclosure may be performed. For example, the wireless communication network 100 may be a New Radio (NR) or 5G network. Wireless devices in the wireless network 100 may be equipped with the tuning circuit described herein to provide a preferred gain or noise figure based on a given source impedance seen by an RFIC as further described herein.

As illustrated in FIG. 1, the wireless network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation Node B (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, a macro BS may have a high transmit power level (e.g., 20 watts (W)) whereas a pico BS, a femto BS, and relays may have a lower transmit power level (e.g., 1 W).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless network 100, and each UE may be stationary or mobile. A UE may also be referred to as a mobile station (MS), a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a Global Positioning System (GPS) device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz, and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for a system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for a system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a cyclic prefix (CP) on the uplink and downlink and include support for half-duplex operation using time-division duplexing (TDD). Beamforming may be supported, and beam direction may be dynamically configured. Multiple-input, multiple-output (MIMO) transmissions with precoding may also be supported. MIMO configurations in the downlink (DL) may support up to 8 transmit antennas with multi-layer DL transmissions up to 8 streams and up to 2 streams per UE. Aggregation of multiple cells may be supported with up to 8 serving cells.

In some examples, access to the air interface may be scheduled, wherein a scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
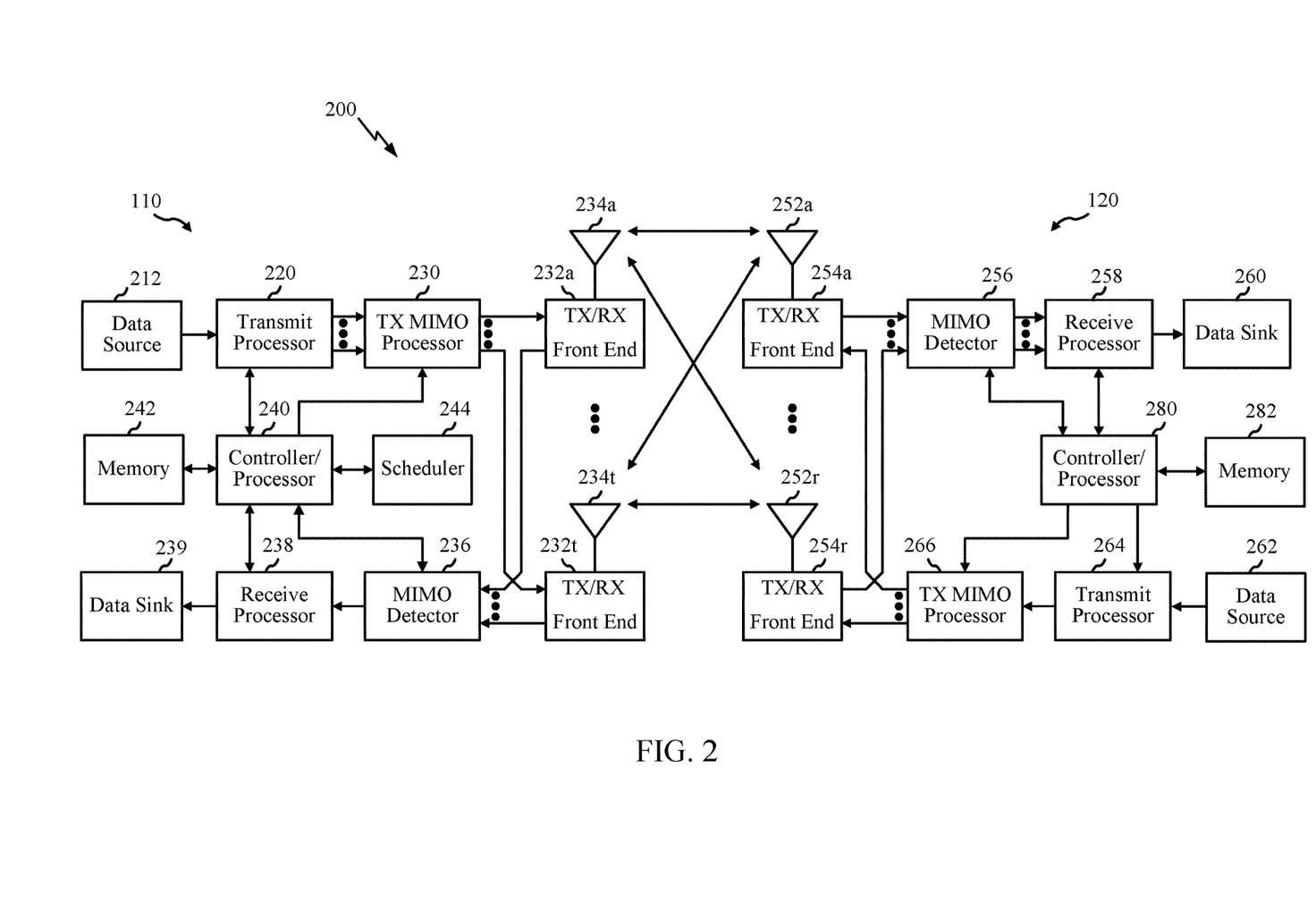
FIG. 2 is a block diagram conceptually illustrating a design of an example base station (BS) and an example user equipment (UE), in accordance with certain aspects of the present disclosure.

FIG. 2 illustrates example components of BS 110 and UE 120 (as depicted in FIG. 1), which may be used to implement aspects of the present disclosure. For example, antennas 252, processors 266, 258, 264, and/or controller/processor 280 of the UE 120 and/or antennas 234, processors 220, 240, 238, and/or controller/processor 240 of the BS 110 may be used to perform the various techniques and methods described herein (e.g., operations 800 of FIG. 8).

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the transmit (TX) front-end circuits 232a through 232t. Each TX front-end circuit 232 may process a respective output symbol stream (e.g., for OFDM, etc.) to obtain an output sample stream. Each TX front-end circuit may further process (e.g., convert to analog, amplify, filter, and upconvert) the output sample stream to obtain a downlink signal. Downlink signals from TX front-end circuits 232a through 232t may be transmitted via the antennas 234a through 234t, respectively.

At the UE 120, the antennas 252a through 252r may receive the downlink signals from the BS 110 and may provide received signals to the receive (RX) front-end circuits 254a through 254r, respectively. Each RX front-end circuit 254 may condition (e.g., filter, amplify, downconvert, and digitize) a respective received signal to obtain input samples. Each RX front-end circuit may further process the input samples (e.g., for OFDM, etc.) to obtain received symbols. A MIMO detector 256 may obtain received symbols from all the RX front-end circuits 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the RX front-end circuits 254a through 254r (e.g., for SC-FDM, etc.), and transmitted to the BS 110. At the BS 110, the uplink signals from the UE 120 may be received by the antennas 234, processed by the TX front-end circuits 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

The controllers/processors 240 and 280 may direct the operation at the BS 110 and the UE 120, respectively. The processor 240 and/or other processors and modules at the BS 110 may perform or direct the execution of processes for the techniques described herein. The memories 242 and 282 may store data and program codes for BS 110 and UE 120, respectively. A scheduler 244 may schedule UEs for data transmission on the downlink and/or uplink. In certain aspects, the TX/RX front-end circuits 232, 254 may include a tuning circuit for adjusting a source impedance seen by a portion of a receive path, as further described herein.

Figure 3:
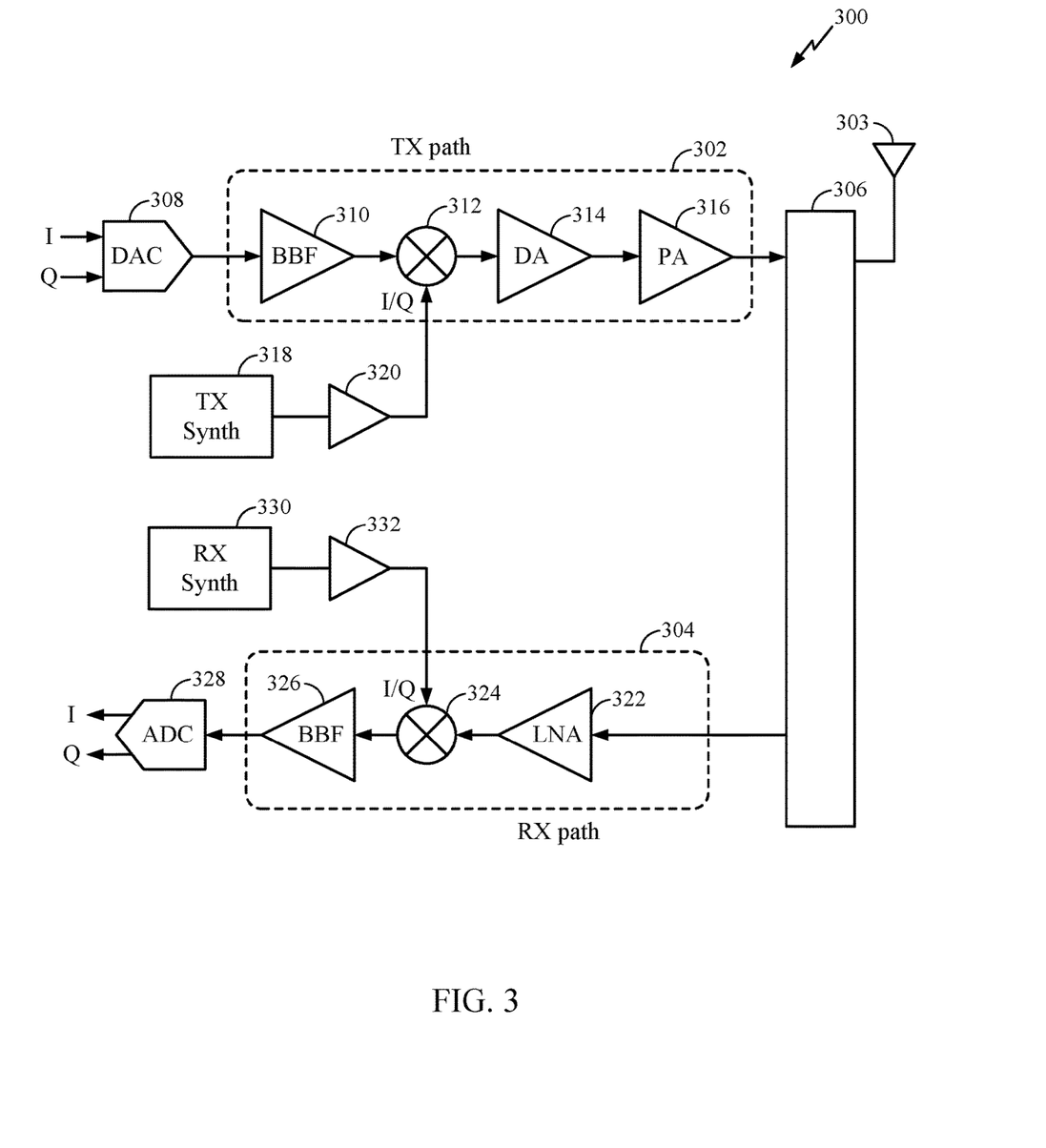
FIG. 3 is a block diagram showing an example transceiver front-end, in accordance with certain aspects of the present disclosure.

FIG. 3 is a block diagram of an example transceiver front-end 300, such as TX/RX front-end circuits 232, 254 in FIG. 2, in which aspects of the present disclosure may be practiced. The transceiver front-end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

In certain aspects, the RX path 304 may include a source impedance tuning circuit (not shown), as described herein, between the interface 306 and the LNA 322.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example Source Impedance Tuning Circuit

An LNA included in an RX path is often designed with trade-offs in mind, such as between a desired source impedance for power matching and a desired source impedance for noise matching. These tradeoffs are taken into account when selecting device impedance values (e.g., resistors, capacitors, inductors, etc.) and tuning for noise-matching. Due to source impedance variations, an LNA is generally tuned for both power-matching and noise-matching, and as a source impedance changes, LNA characteristics may also shift resulting in variation in device performance. In certain aspects, a preferred noise figure does not necessarily coincide with maximum power transfer. For instance, the source-reflection coefficient ($\Gamma_S$) may have a dependency based upon the source impedance. To further complicate this, radio frequency integrated circuits (RFICs) are generally tuned to a fixed source impedance (e.g., 50Ω interface) and guaranteed over a wide-range of 2:1 voltage standing wave ratio (VSWR) circles. If there is a way to detect the source impedance, a source impedance tuning circuit as described herein may adjust the source impedance as seen by the LNA to any desired value, in an effort, for example, to provide a certain gain, a certain noise figure, or a combination thereof.

Certain resonant circuits (e.g., a jammer reject filter implemented as an N-path filter) in a portion of the RX path may by highly sensitive to variations in the source impedance as seen by the LNA. This sensitivity may enable a tuning circuit arranged in a portion of the RX path to effectively determine and adjust the source impedance to any desired value, resulting in an RFIC that may compensate, or at least adjust, for variations in the source impedance during operation of the RFIC or for different operational modes of the RFIC.

Figure 4:
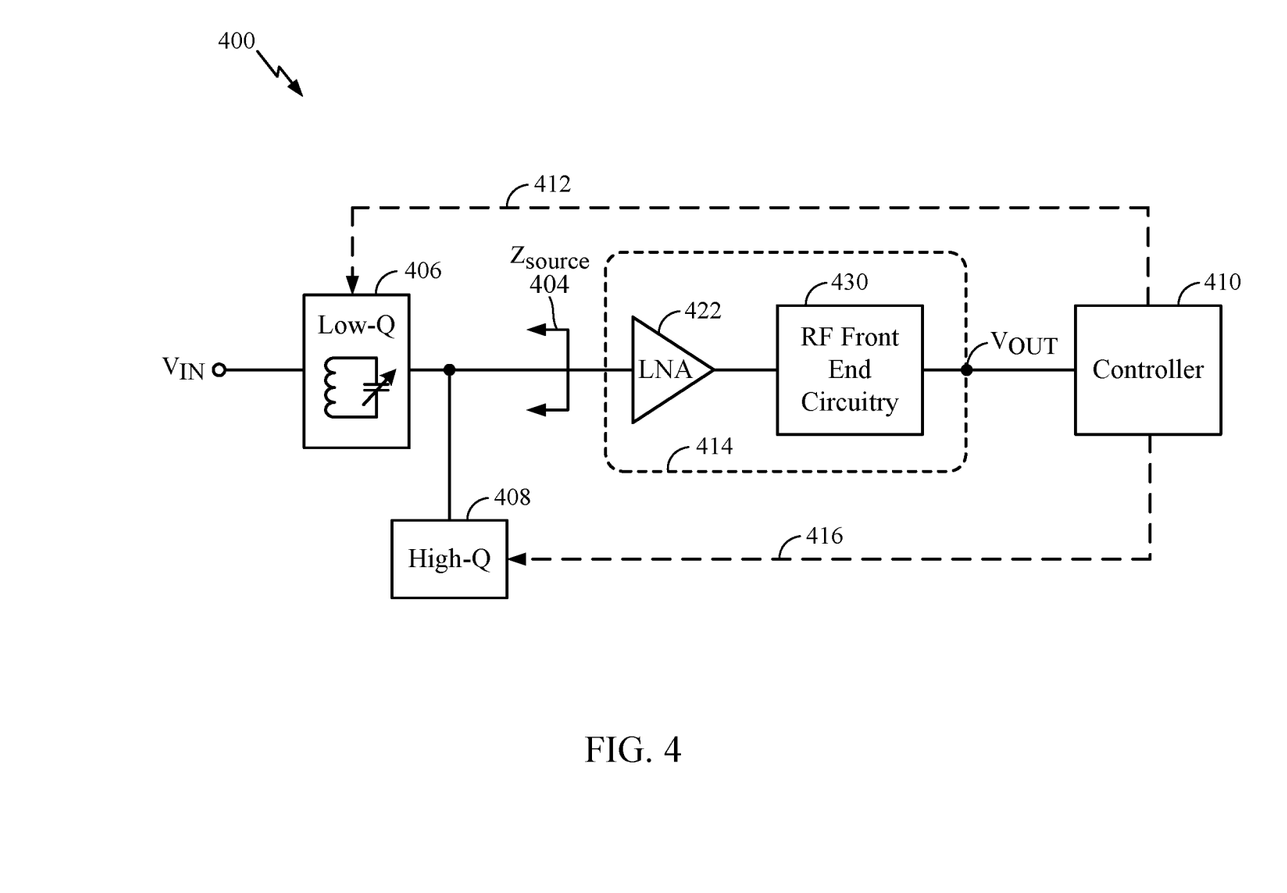
FIG. 4 is a block diagram illustrating an example receive chain of a radio frequency (RF) front-end including a tuning circuit, in accordance with certain aspects of the present disclosure.

FIG. 4 illustrates an example portion of a receive path (e.g., RX path 304) of an RF front-end comprising a tuning circuit 400, in accordance with certain aspects of the present disclosure. As shown, the tuning circuit 400, an LNA 422, and various RF front-end circuitry 430 (e.g., a mixer 324, a BBF 326, and an ADC 328) are arranged in at least a portion 416 of the receive path (e.g., RX path 304). The tuning circuit 400 includes a first tunable resonant circuit 406, a second tunable resonant circuit 408, a first control input 412, and a second control input 414. The tuning circuit 400 may be configured to adjust the source impedance ($Z_{source}$, which may be due, e.g., to the interface 306 and the antenna 303) as seen by the LNA 422, in an effort to tune the source impedance to a desired value (e.g., at a particular frequency).

The first tunable resonant circuit 406 has an output coupled to an input of the portion 416 of the receive path. The first tunable resonant circuit 406 may be, for example, an inductor-capacitor (LC) circuit having an inductive element (such as a winding of a transformer) connected in parallel with a tunable capacitive element as further described herein. For instance, the tunable capacitive element may be a variable capacitor or a plurality of selectively coupled capacitive elements, such as a binary-weighted capacitive array. A binary-weighted capacitive array includes an array of capacitors arranged in parallel branches, each branch having a binary-weighted capacitance value and selected via a switch coupled to the branch. One or more branches of the capacitive array are selected to achieve different capacitance values for the array. The first tunable resonant circuit 406 may be external to or integrated with an RFIC, which may include the portion 416 of the receive path.

The first control input 412 is coupled to the first tunable resonant circuit 406 and configured to adjust an impedance of the first tunable resonant circuit 406 based on a frequency response of an output of the portion 416 of the receive path. For instance, the controller 410 may apply a control signal to the first control input 412 indicating to the first tunable resonant circuit 406 to adjust its impedance, such as adjusting the capacitance of the tunable capacitive element. The first control input 412 may be configured to adjust the impedance of the first tunable resonant circuit 406 to achieve a target imbalance in a passband of the frequency response of the output of the portion 416 of the receive path.

The second tunable resonant circuit 408 has an input coupled to the output of the first tunable resonant circuit 406 and to the input of the portion 416 of the receive path. The second tunable resonant circuit 408 may be a jammer reject filter (JRF), which may be a bandpass filter with steep rejection (implemented, for example, by an N-path filter, as further described herein). The second tunable resonant circuit 408 has a higher quality factor (Q) than the first tunable resonant circuit 406. The second tunable resonant circuit 408 may be external to or integrated with an RFIC, which may include the portion 416 of the receive path. The second tunable resonant circuit 408 may be sensitive to variations in the source impedance 404 ($Z_{source}$) as seen by the LNA. This sensitivity may enable the tuning circuit 400 to tune the source impedance 404 by making adjustments to the variable impedance(s) of the second tunable resonant circuit 408, providing, for example, a desired gain and/or a desired noise figure.

The second control input 414 is coupled to the second tunable resonant circuit 408 and configured to adjust an admittance of the second tunable resonant circuit 408. For instance, the controller 410 may apply a control signal to the second control input 414 indicating to the second tunable resonant circuit 408 to adjust its admittance, such as adjusting the capacitance of capacitive elements included in the second tunable resonant circuit 408 as further described herein. The second control input 414 may be configured to adjust the admittance of the second tunable resonant circuit 408 to achieve a target source impedance (e.g., 50Ω). For certain aspects, the second tunable resonant circuit 408 may be disabled after the target source impedance is achieved. For instance, the controller 410 may apply a control signal to the second control input 414 indicating to the second tunable resonant circuit 408 to disable itself (e.g., disconnecting itself from the portion 416 of the receive path).

Figure 5A:
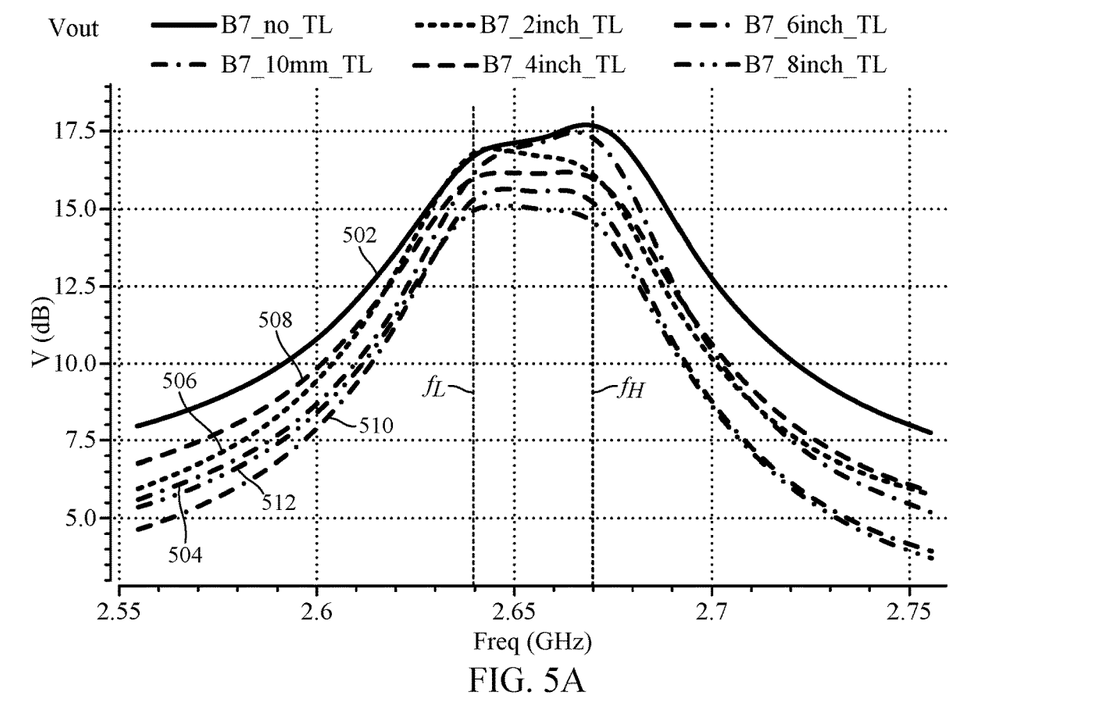
FIG. 5A illustrates example frequency responses of a portion of a receive path in an RF front-end for different settings of a tuning circuit, in accordance with certain aspects of the present disclosure.
Figure 5B:
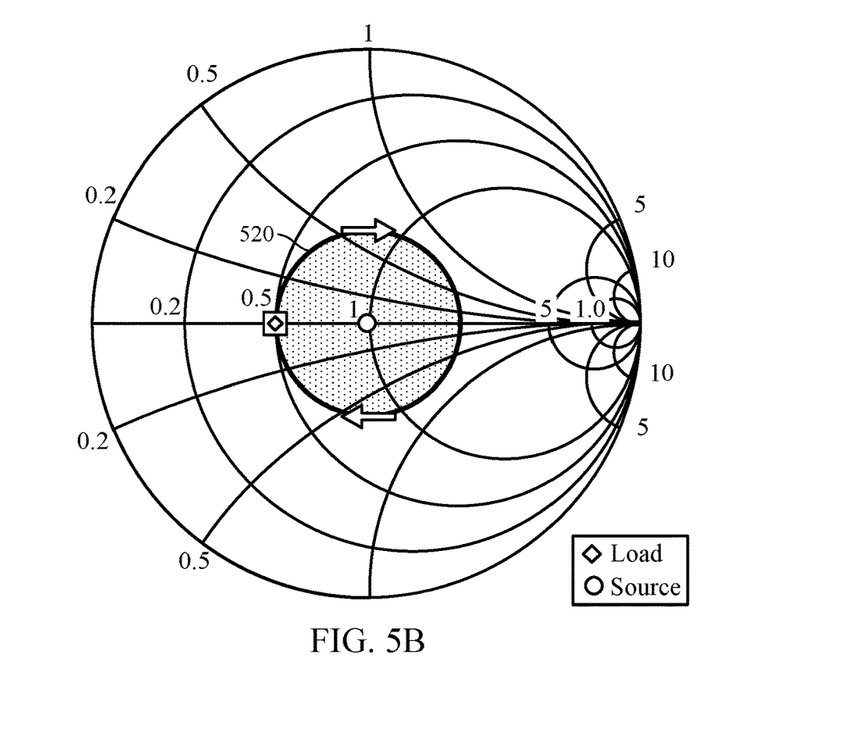
FIG. 5B illustrates an example voltage standing wave ratio (VSWR) circle on a Smith Chart for the portion of the receive path, in accordance with certain aspects of the present disclosure.

FIGS. 5A and 5B illustrate, respectively, an example graph of frequency responses of the output signal for a portion of the receive path and an example voltage standing wave ratio (VSWR) circle of the portion of the receive path on a Smith chart, in accordance with certain aspects of the present disclosure. As shown in FIG. 5A, the curves 502, 504, 506, 508, 510, and 512 are functions of voltage ($V_{OUT}$) with respect to frequency. In certain aspects, the transmission line length between the antenna (e.g., antenna 303) and the LNA (e.g., LNA 322) of the front-end receive path may vary across wireless devices, such as different wireless device types incorporating the same RFIC. For instance, one type of wireless device may have a first transmission line length between the antenna and the RFIC, whereas another type of wireless device may have a second transmission line length between its antenna and the RFIC, different from the first length.

The curves 502, 504, 506, 508, 510, and 512 represent the frequency response of the output signal for various transmission line lengths, representing different source impedances seen by the LNA. Curve 502 represents the frequency response for no transmission line, curve 504 represents the frequency response for a transmission line having a length of 10 mm, curve 506 represents the frequency response for a transmission line having a length of 2 inches, curve 508 represents the frequency response for a transmission line having a length of 4 inches, curve 510 represents the frequency response for a transmission line having a length of 6 inches, and curve 512 represents the frequency response for a transmission line having a length of 8 inches.

FIG. 5A demonstrates that the spectral gain of $V_{OUT}$ may vary based on the transmission line length of the source impedance. In certain aspects, the frequency response of the output signal may exhibit an imbalance between the gains associated with the cutoff frequencies ($f_L$ and $f_H$) of the bandpass frequency response. By measuring various parameters of the frequency response (e.g., gains at $f_L$ and $f_H$), the controller 410 of the tuning circuit 400 may detect an approximate source impedance coupled to the receive path and tune the impedance of the first tunable resonant circuit based on the source impedance. For instance, the controller 410 may compare the gains of the output signal ($V_{OUT}$) at the cutoff frequencies ($f_L$ and $f_H$), where an imbalance between the cutoff frequencies implies shifts along imaginary impedances (i.e., reactances). As shown, curves 502 and 506 have larger gains at the upper cutoff frequencies $f_H$ than the lower cutoff frequencies $f_L$. As another example, curve 506 exhibits a larger gain at the lower cutoff frequency $f_L$ than the upper cutoff frequency $f_H$. This cutoff frequency imbalance may indicate to the controller which way the tuning circuit should be adjusted, in an effort to flatten the passband and/or achieve a desired target source impedance. On the other hand, the controller may identify that the cutoff frequencies ($f_L$ and $f_H$) are within a suitable threshold (e.g., $|(f_L-f_H)| \leq 0.1$ dB). For instance, curves 504, 510, and 512 may be identified as being within a suitable threshold and require no additional compensation for the imaginary component of the source impedance. In certain aspects, a shift from target cutoff frequencies (e.g., 3-dB-down frequencies), roll-off between the passband and stopband, and/or Q of the second tunable resonant circuit may imply shifts along the real component of the source impedance.

As shown in FIG. 5B, the impedance seen by the second tunable resonant circuit 408 follows along the VSWR circle 520 of the Smith chart. That is, depending on the frequency response detected by the controller, the tuning circuit may be adjusted to compensate for the imaginary and/or real impedance components of the source impedance along the VSWR circle 520. For instance, the frequency response of the output signal may be compensated, or at least adjusted, by adjusting the poles of the second tunable resonant circuit 408 and/or the capacitance of the first tunable resonant circuit 406. The frequency response may be adjusted to provide a certain gain, certain noise figure, or a combination for the identified source impedance. The frequency response may also be adjusted to provide any arbitrary source impedance value, e.g., any point along a VSWR circle of the Smith Chart.

Figure 6:
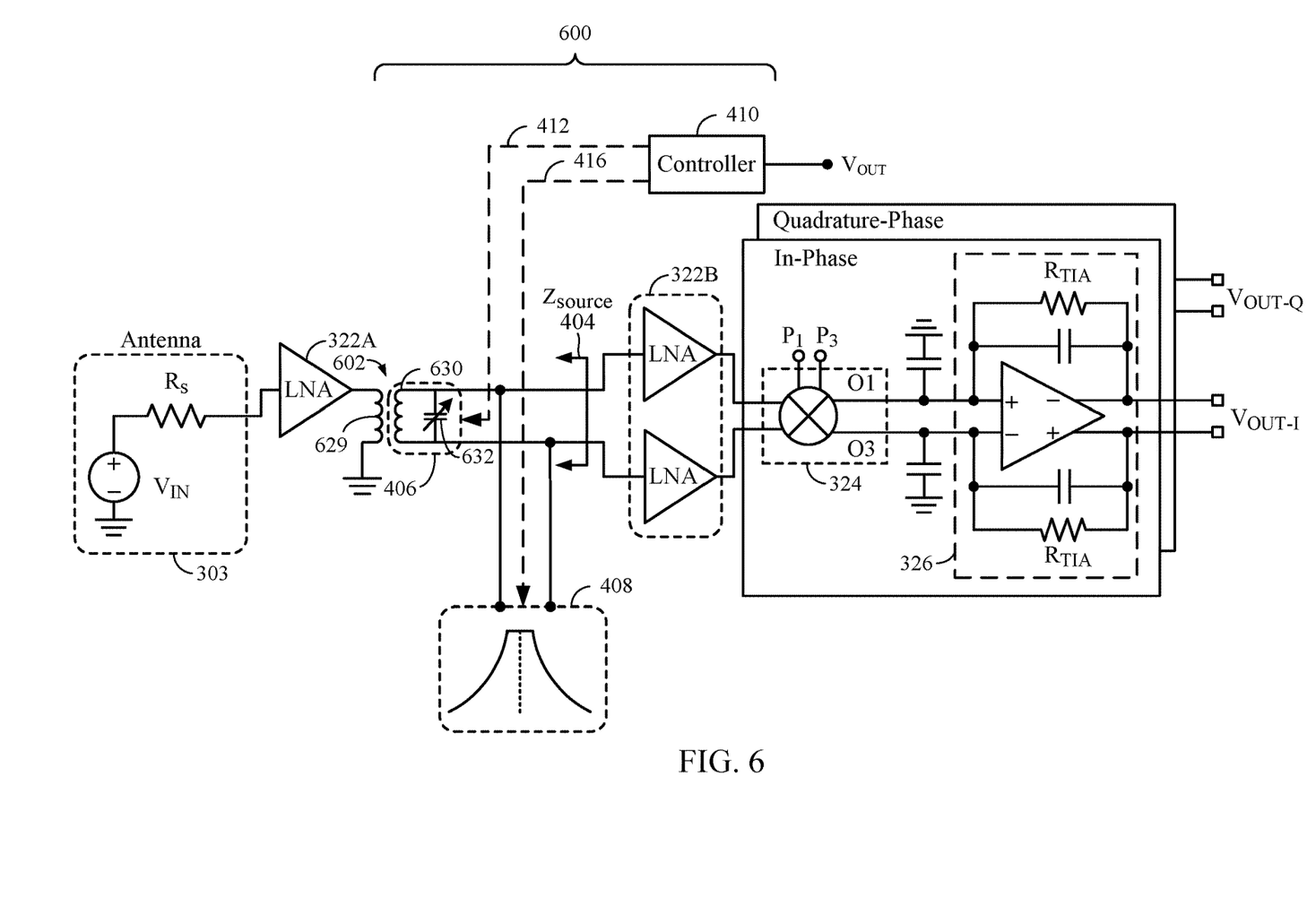
FIG. 6 is a block diagram illustrating a portion of an example receive chain of an RF front-end including a tuning circuit, in accordance with certain aspects of the present disclosure.

In certain aspects, the first tunable resonant circuit 406 may include a secondary winding of a transformer coupled in parallel with a capacitive array. For example, FIG. 6 illustrates an example receive chain (e.g., RX path 304) of an RF front-end comprising a tuning circuit 600, in accordance with certain aspects of the present disclosure. As shown, the first tunable resonant circuit 406 includes an inductive element (such as the secondary winding 630 of the transformer 602, which also includes a primary winding 629 inductively coupled to the secondary winding 630) and a tunable capacitive element 632 (such as a binary-weighted capacitive array).

In certain aspects, the LNA 322 of FIG. 3 may comprise two separate LNAs 322A and 322B. For certain aspects, the first LNA 322A may be external to an RF integrated circuit (RFIC), while the second LNA 322B may be included in the RFIC, along with other circuits (e.g., the mixer 324 and the BBF 326). For other aspects, the first LNA 322A and the second LNA 322B may both be included in the RFIC, along with other circuits (e.g., the mixer 324 and the BBF 326).

In certain aspects, the second tunable resonant circuit 408 may be implemented by an N-path filter. The N-path filter may have N-parallel branches (e.g., N=4) selectively connected with the input node, which is a common node for the plurality of branches. Those having ordinary skill in the art of N-path filters will understand that there may be more or less than N=4 branches in any of the various aspects of the present disclosure provided herein. For ease of description and understanding by the reader, the remainder of the disclosure will present circuits with N=4 branches.

Figure 7A:
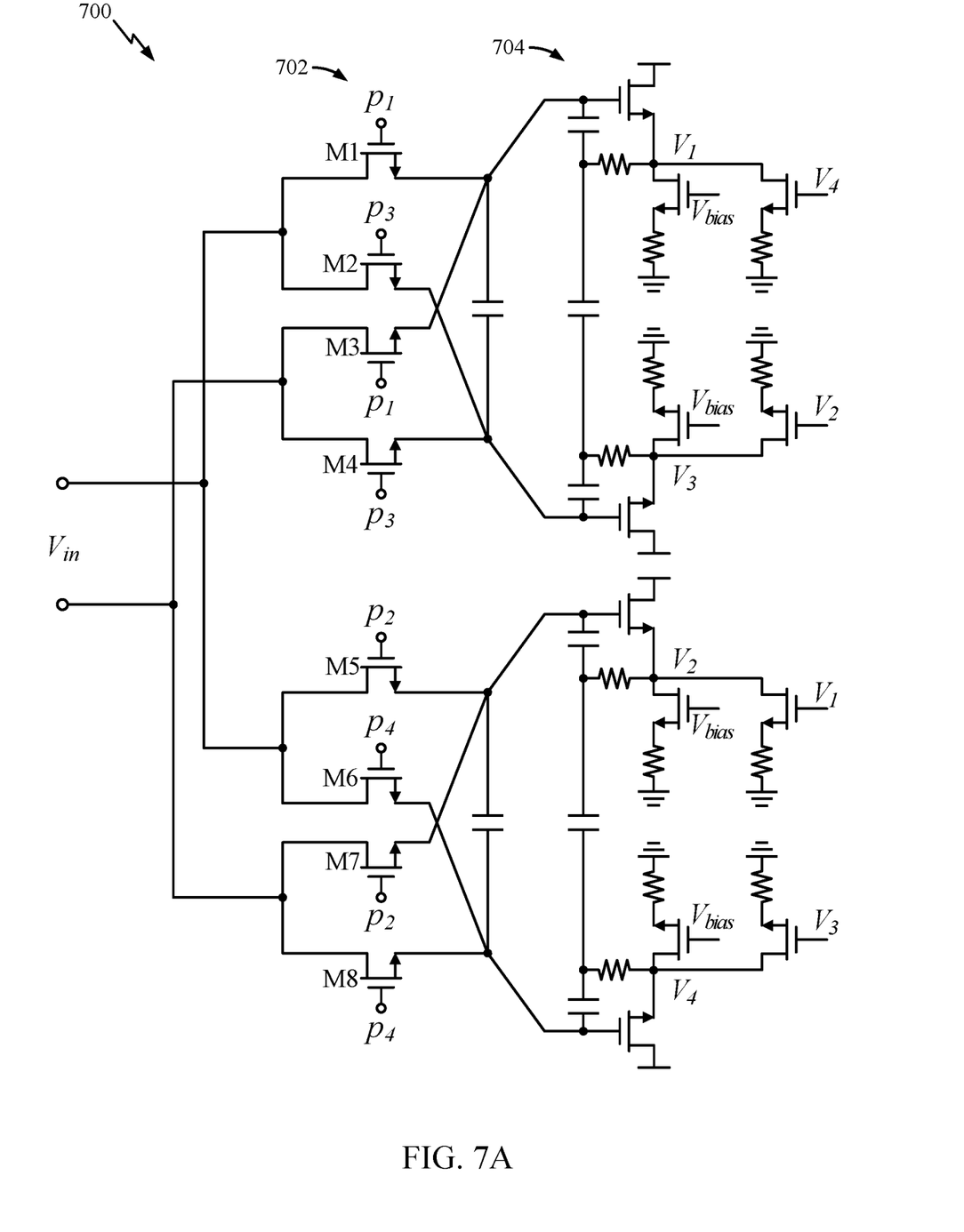
FIG. 7A is a schematic diagram of an example N-path filter, in accordance with certain aspects of the present disclosure.

FIG. 7A illustrates an example differential N-path filter 700, in accordance with certain aspects of the present disclosure. The N-path filter 700 may include a number of switches 702 (e.g., N switches, one in each filter branch), which may be implemented with n-channel metal-oxide-semiconductor (NMOS) transistors M1-M8. For other aspects, the switches 702 in the N-path filter may be implemented with p-channel metal-oxide-semiconductor (PMOS) transistors. However, for ease of description and understanding by the reader, the remainder of the disclosure will use NMOS transistors to implement the branch switches 702 of the N-path filters.

Figure 7B:
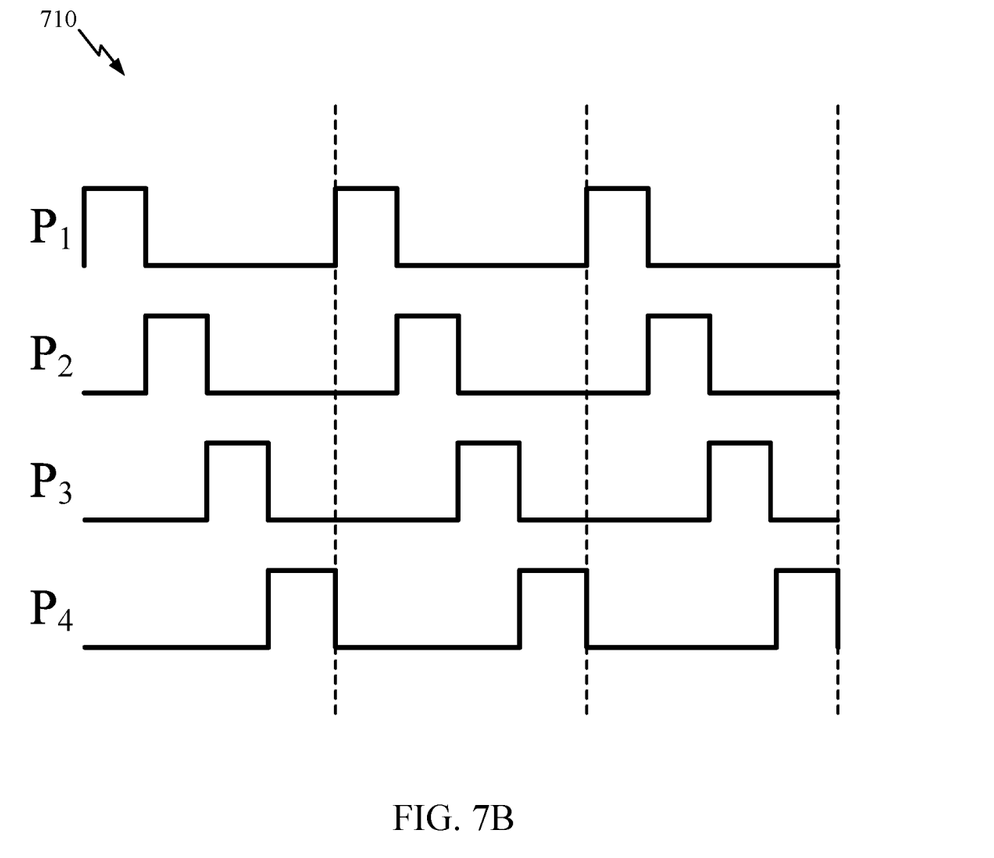
FIG. 7B is an example timing diagram illustrating signals used to control switching operations of transistors in the N-path filter of FIG. 7A, in accordance with certain aspects of the present disclosure.

The transistors M1-M8 may be controlled using four 25% duty cycle signals $P_1$, $P_2$, $P_3$, and $P_4$, respectively, as illustrated in the timing diagram 710 of FIG. 7B. In this manner, one switch 702 may be opened before or as the next switch in the control signal sequence is closed. That is, each of the transistors M1-M8 may be driven such that the transistors are activated in sequence and periods during which certain transistors are activated (i.e., each switch 702 is closed) ideally do not overlap, although a small amount of overlap may be tolerated for practical implementations. The duty cycle of the control signals may be a function of the number N of filter branches (e.g., equal to 1/N). The amount of overlap, if any, in the control signals $P_1$, $P_2$, $P_3$, etc. may be a small fraction (e.g., $\frac{1}{10}^{th}$) of the duty cycle. In this case, a switching frequency of the control signals $P_1$, $P_2$, $P_3$, etc. may establish a center frequency of a bandwidth for the N-path filter 700.

Referring to FIG. 7A, the N-path filter 700 may include a number of impedance elements 704 in each branch having one or more poles. Any of various suitable types of impedance elements 704 may be used in the branches of the N-path filter. As shown, the impedance elements 704 may include capacitive elements and/or resistive elements. The impedance elements may additionally or alternatively include inductive elements or impedance converters (e.g., a general impedance converter, negative impedance converter, impedance inverter, or negative impedance inverter). The impedance elements 704 may be tunable, such as variable capacitors or variable resistors, to enable the admittance of the N-path filter 700 to be adjusted to achieve a target source impedance as described herein.

Figure 8:
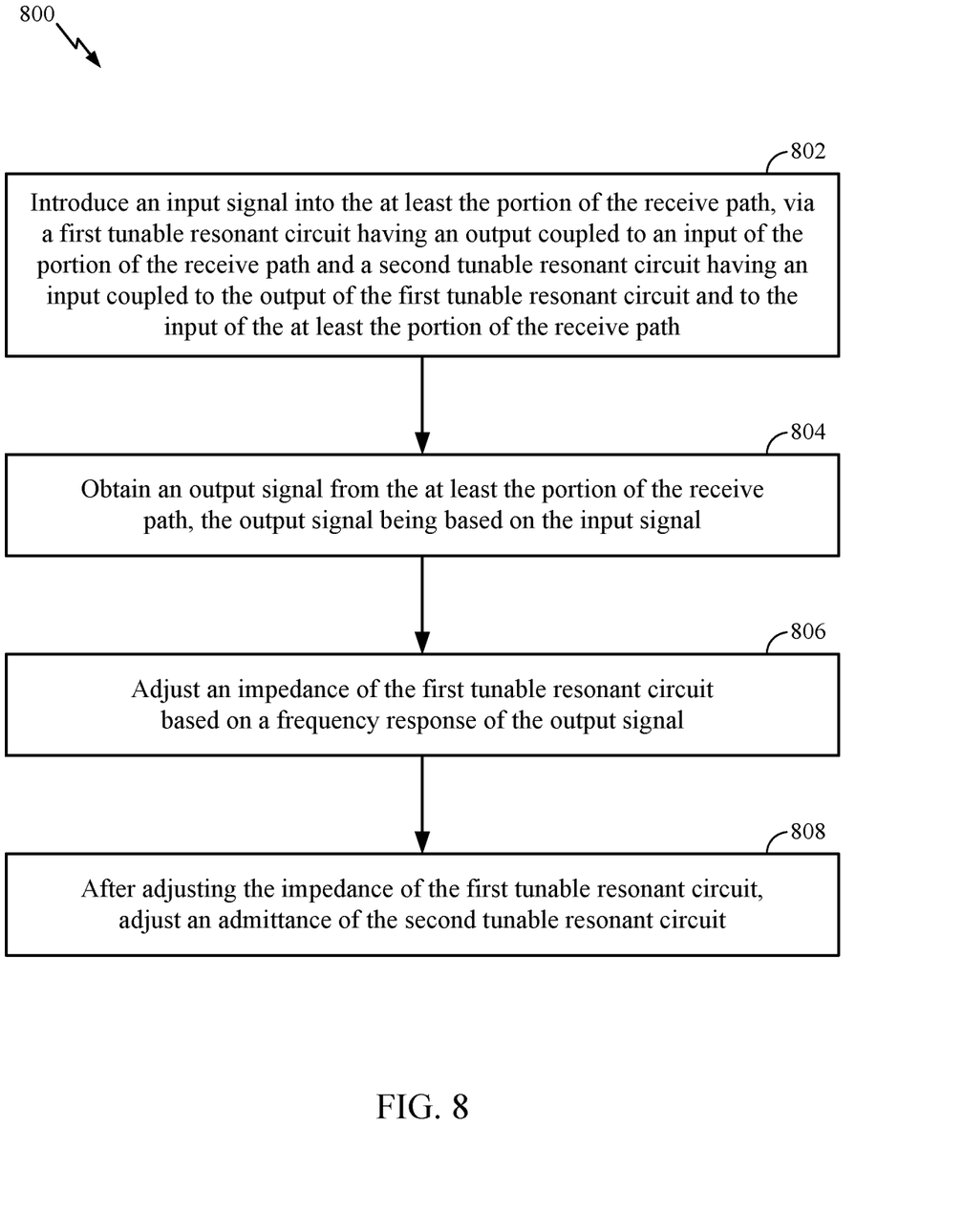
FIG. 8 is a flow diagram of example operations for tuning a source impedance, in accordance with certain aspects of the present disclosure

FIG. 8 is a flow diagram illustrating example operations 800 for tuning a source impedance for at least a portion of a receive path in a radio frequency front-end, in accordance with certain aspects of the present disclosure. The operations 800 may be performed, for example, by a controller coupled to or integrated with an RFIC (e.g., controller 410).

The operations 800 may begin, at block 802, where an input signal is introduced into the at least the portion of the receive path, via a first tunable resonant circuit having an output coupled to an input of the portion of the receive path and a second tunable resonant circuit having an input coupled to the output of the first tunable resonant circuit and to the input of the at least the portion of the receive path. The input signal may be introduced by applying one or more test tones to the RF front-end of a wireless device (e.g., BS 110 or UE 120) and performing a single-point discrete Fourier Transform (DFT), for example, during a calibration phase (e.g., before the wireless device is deployed).

At block 804, the controller obtains an output signal from the at least the portion of the receive path, the output signal being based on the input signal. In certain aspects, the output signal may be an output of the RX path of the RF front-end. For example, the controller 410 may obtain an output signal of $V_{OUT}$ as shown in FIG. 4.

At block 806, the controller may adjust an impedance of the first tunable resonant circuit based on a frequency response of the output signal. In certain aspects, the output signal may be spectrally analyzed to provide a frequency response of the portion of the receive path as shown in FIG. 5A. For instance, the controller may identify the gains of the output signal at the cutoff frequencies and make any adjustments to the impedance of the first tunable resonant circuit based on any imbalance between the cutoff frequencies.

At block 808, the controller, after adjusting the impedance of the first tunable resonant circuit, may adjust an admittance of the second tunable resonant circuit. For example, the Q of the output signal may be measured by the controller, and the admittance of the second tunable resonant circuit may be adjusted to achieve a target source impedance. In certain aspects, the controller may identify a shift from target cutoff frequencies, a shift from a target roll-off (i.e., steepness of rejection), and a target Q, and make adjustments to one or more variable impedance elements of the second tunable resonant circuit to compensate, or at least adjust, for this shift in cutoff frequencies, roll-off, and/or Q.

In certain aspects, the controller may disable the second tunable resonant circuit after the target source impedance is achieved using the first tunable resonant circuit. For instance, a switch coupled between the second tunable resonant circuit and the portion of the receive path may be opened to disconnect the second tunable resonant circuit.

It should be appreciated that the tuning circuit described herein enables a wireless device to estimate a source impedance as seen by an RFIC or along a portion of a receive path of an RF front-end. This enables the tuning circuit as described herein to adjust the source impedance as seen by the LNA to any desired value, in an effort, for example, to provide a certain gain, a certain noise figure, or a combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for introducing an input signal may include a tunable resonant circuit such as the first tunable resonant circuit 406 and the second tunable resonant circuit 408. Means for obtaining an output signal may include signal processing circuitry arranged in the RX path of an RF front-end circuit, such as the RF front-end circuitry 430 and/or the controller 410. Means for adjusting impedance may include a tunable resonant circuit or a tunable capacitive element such as a first tunable resonant circuit 406 or a tunable capacitive element 632. The means for adjusting impedance may additionally or alternatively include a control circuit and control signals, such as the controller 410 and the first control input 412, respectively. Means for adjusting an admittance includes a tunable resonant circuit such as the second tunable resonant circuit 408 or N-path filter 700. The means for adjusting admittance may additionally or alternatively include a control circuit and control signals, such as the controller 410 and the second control input 414, respectively.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A tuning circuit for tuning a source impedance for at least a portion of a receive path in a radio frequency front-end, the tuning circuit comprising:

a first tunable resonant circuit having an output coupled to an input of an amplifier included in the at least the portion of the receive path;
a second tunable resonant circuit having an input coupled to the output of the first tunable resonant circuit and to the input of the amplifier;
a first control input coupled to the first tunable resonant circuit and configured to adjust an impedance of the first tunable resonant circuit based on a target imbalance in a passband of a frequency response of an output of the at least the portion of the receive path; and
a second control input coupled to the second tunable resonant circuit and configured to adjust an admittance of the second tunable resonant circuit.

2. The tuning circuit of claim 1, wherein the second tunable resonant circuit comprises an N-path filter.

3. The tuning circuit of claim 1, wherein the second tunable resonant circuit has a higher quality factor (Q) than the first tunable resonant circuit.

4. The tuning circuit of claim 1, wherein the first tunable resonant circuit comprises a secondary winding of a transformer coupled in parallel with a capacitive array, the capacitive array comprising a plurality of selectively coupled capacitive elements.

5. The tuning circuit of claim 4, wherein the capacitive array comprises a binary-weighted capacitive array.

6. The tuning circuit of claim 1, wherein the second control input is configured to adjust the admittance of the second tunable resonant circuit to achieve a target source impedance.

7. The tuning circuit of claim 6, wherein the second control input is further configured to disable the second tunable resonant circuit after the target source impedance is achieved.

8. A method of tuning a source impedance for at least a portion of a receive path in a radio frequency front-end, the method comprising:

introducing an input signal into the at least the portion of the receive path, via a first tunable resonant circuit having an output coupled to an input of an amplifier included in the portion of the receive path and a second tunable resonant circuit having an input coupled to the output of the first tunable resonant circuit and to the input of the amplifier;
obtaining an output signal from the at least the portion of the receive path, the output signal being based on the input signal;
adjusting an impedance of the first tunable resonant circuit based on a target imbalance in a passband of a frequency response of the output signal; and
after adjusting the impedance of the first tunable resonant circuit, adjusting an admittance of the second tunable resonant circuit.

9. The method of claim 8, wherein adjusting the admittance of the second tunable resonant circuit comprises adjusting a capacitance in each branch of an N-path filter.

10. The method of claim 8, wherein the second tunable resonant circuit has a higher quality factor (Q) than the first tunable resonant circuit.

11. The method of claim 8, wherein adjusting the impedance of the first tunable resonant circuit comprises adjusting a capacitance of a capacitive array coupled in parallel with a secondary winding of a transformer.

12. The method of claim 11, wherein the capacitive array comprises a binary-weighted capacitive array.

13. The method of claim 8, wherein adjusting the admittance comprises adjusting the admittance of the second tunable resonant circuit to achieve a target source impedance.

14. The method of claim 13, further comprising:
disabling the second tunable resonant circuit after the target source impedance is achieved; and
operating the receive path of the radio frequency front-end with the second tunable resonant circuit disabled.

15. An apparatus for tuning a source impedance for at least a portion of a receive path in a radio frequency front-end, the apparatus comprising:
means for introducing an input signal into the at least the portion of the receive path, the means for introducing comprising:
first tunable resonating means coupled to an input of means for amplifying included in the at least the portion of the receive path; and
second tunable resonating means coupled to an output of the first tunable resonating means and to the input of the means for amplifying;
means for obtaining an output signal from the at least the portion of the receive path, the output signal being based on the input signal;
means for adjusting an impedance of the first tunable resonating means based on a target imbalance in a passband of a frequency response of the output signal; and
means for adjusting an admittance of the second tunable resonating means, after adjusting the impedance of the first tunable resonating means.

16. The apparatus of claim 15, wherein the second tunable resonating means has a higher quality factor (Q) than the first tunable resonating means.

17. The apparatus of claim 15, wherein the means for adjusting the admittance of the second tunable resonating means is configured to adjust the admittance of the second tunable resonating means to achieve a target source impedance.

* * * * *